United States Patent
Lee et al.

(10) Patent No.: US 8,537,609 B2
(45) Date of Patent: Sep. 17, 2013

(54) MEMORY DEVICE AND METHOD OF OPERATING THE SAME

(75) Inventors: Ming-Hsiu Lee, Hsinchu (TW); Chieh-Fang Chen, Taipei County (TW)

(73) Assignee: Macronix International Co., Ltd., Hsinchu (TW)

( * ) Notice: Subject to any disclaimer, the term of this patent is extended or adjusted under 35 U.S.C. 154(b) by 73 days.

(21) Appl. No.: 13/161,129

(22) Filed: Jun. 15, 2011

(65) Prior Publication Data

US 2012/0320669 A1    Dec. 20, 2012

(51) Int. Cl.
*G11C 11/34* (2006.01)

(52) U.S. Cl.
USPC .......... 365/177; 365/121; 365/225.6

(58) Field of Classification Search
USPC ............... 365/177, 225.6, 121
See application file for complete search history.

(56) References Cited

U.S. PATENT DOCUMENTS

| | | | | |
|---|---|---|---|---|
| 5,060,194 | A * | 10/1991 | Sakui et al. | 365/177 |
| 5,694,367 | A * | 12/1997 | Toyoshima et al. | 365/207 |
| 7,483,296 | B2 * | 1/2009 | Bedeschi et al. | 365/175 |
| 8,144,500 | B2 * | 3/2012 | Kono | 365/148 |
| 8,270,201 | B2 * | 9/2012 | Sasaki | 365/148 |
| 2010/0177553 | A1 | 7/2010 | Lee et al. | |

* cited by examiner

*Primary Examiner* — Pho M Luu
(74) *Attorney, Agent, or Firm* — Volpe and Koenig, P.C.

(57) ABSTRACT

A memory device is provided. The memory device includes a memory array; a first circuit electrically connected to the memory array, and causing the memory array to be operated in a first mode; and a second circuit electrically connected to the memory array, and causing the memory array to be operated in a second mode.

17 Claims, 7 Drawing Sheets

MEMORY DEVICE AND METHOD OF OPERATING THE SAME

FIELD OF THE INVENTION

The present invention relates to a memory device, and more particularly to a memory device immune to temperature.

BACKGROUND OF THE INVENTION

The traditional phase change memory is operating in the unipolar mode, which means that the reset current and the set current are in the same direction. The memory state is defined by the phase of the phase change material, i.e. the amorphous phase for the high-R (high-resistance) state and the crystalline phase for the low-resistor (low-resistance) state. Cells operated in the unipolar mode can have a small array size, good data retention under a low temperature range (under 85° C.), very good cycling endurance and a high operation speed.

Please refer to FIG. 1(a), which shows a conventional unipolar addressing circuit for a memory cell. The memory cell 101 includes a first electrode 1011, a second electrode 1012 and a memory material 1013 located between the first electrode 1011 and the second electrode 1012. The unipolar addressing circuit 102 includes a transistor 103, a bit line 104, a word line 105 and a source line 107.

Please refer to FIG. 1(b), which shows the waveform of the gate voltage in the unipolar operation mode of FIG. 1(a). The transverse axle represents the time, and the unit thereof is nanosecond; the vertical axle represents the voltage, and the unit thereof is voltage. In FIG. 1(b), the waveform WF1 represents the waveform of the voltage $V_{g1}$ applied to the gate of the transistor 103, and the voltage $V_{g1}$ is the voltage $V_{WL1}$ applied to the word line 105. In FIG. 1(a), a first bias operation of the addressing circuit 102 is provided to the memory cell 101. The first bias operation enables the memory cell 101 to be programmed to a high-R state. The first bias operation includes applying a voltage $V_{BL1}$ of 4 V to the bit line 104, applying the voltage $V_{WL1}$ to the word line 105, applying a voltage $V_{sub}$ of 0 V to the substrate B of the transistor 103, and applying a voltage $V_{SL1}$ of 0 V to the source line 107.

In FIG. 1(b), the rising time, duration time and falling time of the waveform WF1 are 19 ns, 70 ns and 2 ns respectively. The voltage $V_{WL1}$ rises from 0 V to 2.4 V in 19 ns and is kept at 2.4 V for 70 ns; at this time, the current passing through the memory cell 101 is the relatively higher current $I_1$ which is 600 μA, as shown in FIG. 1(a). Then, the voltage $V_{WL1}$ falls from 2.4 V to 0 V in 2 ns. The waveform WF1 forms the process of high current and rapid falling, which causes an amorphous phase change for the memory material 1013. The amorphous phase change will result in a high-R state of the memory material 1013.

Please refer to FIG. 1(c), which shows another conventional unipolar addressing circuit for a memory cell. The unipolar addressing circuit 112 of FIG. 1(c) differs from the unipolar addressing circuit 102 of FIG. 1(a) in that the voltage applied to the word line 105 is $V_{WL2}$. Please refer to FIG. 1(d), which shows the waveform of the gate voltage in the unipolar operation mode of FIG. 1(c). The transverse axle represents the time, and the unit thereof is nanosecond; the vertical axle represents the voltage, and the unit thereof is voltage. In FIG. 1(d), the waveform WF2 represents the waveform of the voltage $V_{g2}$ applied to the gate of the transistor 103, and the voltage $V_{g2}$ is the voltage $V_{WL2}$ applied to the word line 105. In FIG. 1(c), a second bias operation of the unipolar addressing circuit 102 is provided to the memory cell 101. The second bias operation enables the memory cell 101 to be erased to a low-R state. The second bias operation includes applying a voltage $V_{BL1}$ of 4 V to the bit line 104, applying the voltage $V_{WL2}$ to the word line 105, applying a voltage $V_{sub}$ of 0 V to the substrate B of the transistor 103, and applying a voltage $V_{SL1}$ of 0 V to the source line 107.

In FIG. 1(d), the rising time, duration time and falling time of the waveform WF2 are 100 ns, 400 ns and 2000 ns respectively. The voltage $V_{WL2}$ rises from 0 V to 1.2 V in 100 ns and is kept at 1.2 V for 400 ns; at this time, the current passing through the memory cell 101 is the relatively lower current $I_2$ which is 350 μA, as shown in FIG. 1(c). Then, the voltage $V_{WL2}$ falls relatively slowly from 1.2 V to 0 V in 2000 ns. The waveform WF2 forms the process of low current and slow falling, which causes a crystalline phase change for the memory material 1013. The crystalline phase change will result in a low-R state of the memory material 1013.

Although the memory cell array operated in the unipolar mode and formed by the memory cell 101 has the above-mentioned advantages, when it is exposed to high temperature, the amorphous state of the memory cell 101 can be annealed, which causes the material to transform from an amorphous phase into a crystalline phase of the low-R state. That is, the data stored in the memory cell 101 are erased due to high temperature, which is the disadvantage of the memory cell 101 operated in the unipolar mode.

Another operation mode is called the bipolar operation mode, which enables the memory cell to be immune to temperature. Please refer to FIG. 2(a), which shows a conventional bipolar addressing circuit for a memory cell. The memory cell 201 includes a third electrode 2011, a fourth electrode 2012, and a memory material 2013 located between the third electrode 2011 and the fourth electrode 2012. The bipolar addressing circuit 202 includes a transistor 203, a bit line 204, a word line 205 and a source line 207.

Please refer to FIG. 2(b), which shows the waveform of the gate voltage in the bipolar operation mode of FIG. 2(a). The transverse axle represents the time, and the unit thereof is nanosecond; the vertical axle represents the voltage, and the unit thereof is voltage. In FIG. 2(b), the waveform WF3 represents the waveform of the voltage $V_{g3}$ applied to the gate of the transistor 203, and the voltage $V_{g3}$ is the voltage $V_{WL3}$ applied to the word line 205. In FIG. 2(a), a third bias operation of the bipolar addressing circuit 202 is provided to the memory cell 201. The third bias operation enables the memory cell 201 to be programmed to a high-R state. The third bias operation includes applying a voltage $V_{BL2}$ of 0 V to the bit line 204, applying the voltage $V_{WL3}$ to the word line 205, applying a voltage $V_{sub}$ of 0 V to the substrate B of the transistor 203, and applying a voltage $V_{SL2}$ of 4 V to the source line 207.

In FIG. 2(b), the rising time, duration time and falling time of the waveform WF3 are 100 ns, 400 ns and 2000 ns respectively. The voltage $V_{WL3}$ rises from 0 V to 3.8 V in 100 ns and is kept at 3.8 V for 400 ns; at this time, the current $I_3$ passing through the memory cell 201 is 400 μA, as shown in FIG. 2(a). Then, the voltage $V_{WL3}$ falls from 3.8 V to 0 V in 2000 ns. In the third bias operation, the electrically insulating layer (not shown) in the memory material 2013 is separated therefrom, which results in a high-R state for the memory material 2013. The insulating layer comprises one or more voids. The memory material 2013 comprises a bulk material and a doping material (not shown). The bipolar operation mode comprises a first and second bias arrangements. The first bias arrangement induces segregation of the doping material from the bulk material to form the insulating layer of the doping material. The second bias arrangement induces re-absorption of the doping material into the bulk material. The bulk material comprises a chalcogenide material, and the doping material comprises a dielectric material.

Please refer to FIG. 2(c), which shows another conventional bipolar addressing circuit for a memory cell. The bipolar addressing circuit 212 of FIG. 2(c) differs from the bipolar addressing circuit 202 of FIG. 2(a) in that the voltage applied to the word line 205 is $V_{WL3}$, the voltage $V_{BL4}$ applied to the bit line 204 is 4 V, and the voltage $V_{SL3}$ applied to the source line 207 is 0V.

Please refer to FIG. 2(d), which shows the waveform of the gate voltage in the bipolar operation mode of FIG. 2(c). The transverse axle represents the time, and the unit thereof is nanosecond; the vertical axle represents the voltage, and the unit thereof is voltage. In FIG. 2(d), the waveform WF4 represents the waveform of the voltage $V_{g4}$ applied to the gate of the transistor 203, and the voltage $V_{g4}$ is the voltage $V_{WL4}$ applied to the word line 205. In FIG. 2(d), a fourth bias operation of the bipolar addressing circuit 212 is provided to the memory cell 201. The fourth bias operation enables the memory cell 201 to be erased to a low-R state. The fourth bias operation includes applying a voltage $V_{BL3}$ of 4 V to the bit line 204, applying the voltage $V_{WL4}$ to the word line 205, applying a voltage $V_{sub}$ of 0 V to the substrate B of the transistor 203, and applying a voltage $V_{SL3}$ of 0 V to the source line 207.

In FIG. 2(d), the rising time, duration time and falling time of the waveform WF4 are 100 ns, 400 ns and 2000 ns respectively. The voltage $V_{WL4}$ rises from 0 V to 1.2 V in 100 ns and is kept at 1.2 V for 400 ns; at this time, the current $I_4$ passing through the memory cell 201 is 350 µA, as shown in FIG. 2(c). Then, the voltage $V_{WL4}$ falls from 1.2 V to 0 V in 2000 ns. Since the fourth bias operation uses an opposite voltage polarity to that of the third bias operation, at least a part of the electrically insulating layer (not shown) in the memory material 2013 is merged thereinto, which results in a low-R state for the memory material 2013.

The memory cell 201 in the bipolar operation mode is much more immune to high temperature. That is, the data stored in such mode can pass the soldering process or is more reliable for critical applications. However, the memory array operated in the bipolar mode and formed by the memory cell 201 has a larger size. Besides, the bias circuit in such mode is more complicated, and has a slower operation speed. Therefore, it is important to manufacture a memory cell array having the advantages of the unipolar operation and the bipolar operation at the same time.

In order to overcome the drawbacks in the prior art, a memory device and the method of operating the same is provided. The particular design in the present invention not only solves the problems described above, but also is easy to be implemented. Thus, the present invention has the utility for the industry.

SUMMARY OF THE INVENTION

In accordance with one aspect of the present invention, a memory device is provided. The memory device uses memory cells having the same structure, and different bias circuits for biasing the memory array. No extra cost is needed when manufacturing the memory device of the present invention. Besides, the memory device of the present invention is immune to high temperature, and has a small size, a high memory capacity, a higher operation speed, high writing times and a reliable data retention ability.

In accordance with another aspect of the present invention, a memory device is provided. The memory device includes a memory array; a first circuit electrically connected to the memory array, and causing the memory array to be operated in a first mode; and a second circuit electrically connected to the memory array, and causing the memory array to be operated in a second mode. The memory array includes a first division and a second division. The first division includes a plurality of first memory cells, and the second division includes a plurality of second memory cells. The first mode is a bipolar operation mode, and the second mode is a unipolar operation mode.

In accordance with a further aspect of the present invention, a memory device is provided. The memory device includes a memory array having a plurality of memory cells respectively operated in a first mode and in a second mode.

In accordance with further another aspect of the present invention, a memory device is provided. The memory device includes a memory array including a first division operated in the first operation mode; and a second division operated in the second operation mode.

In accordance with further another aspect of the present invention, a method of operating a memory device including a first division and a second division is provided. The method includes steps of providing a bipolar operation to the first division; and providing a unipolar operation to the second division.

In accordance with further another aspect of the present invention, a method of operating a memory device is provided. The method includes steps of dividing a memory array into a first cell and a second cell; and storing a datum in the first cell in a reliable way so that the first cell provides the datum to the second cell when the second cell needs the datum.

In accordance with further another aspect of the present invention, a method of operating a memory device is provided. The method includes steps of dividing a memory array into a first cell and a second cell; and storing a datum in the first cell in a reliable way so that the datum is obtained from the first cell when the second cell loses the datum.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1A:
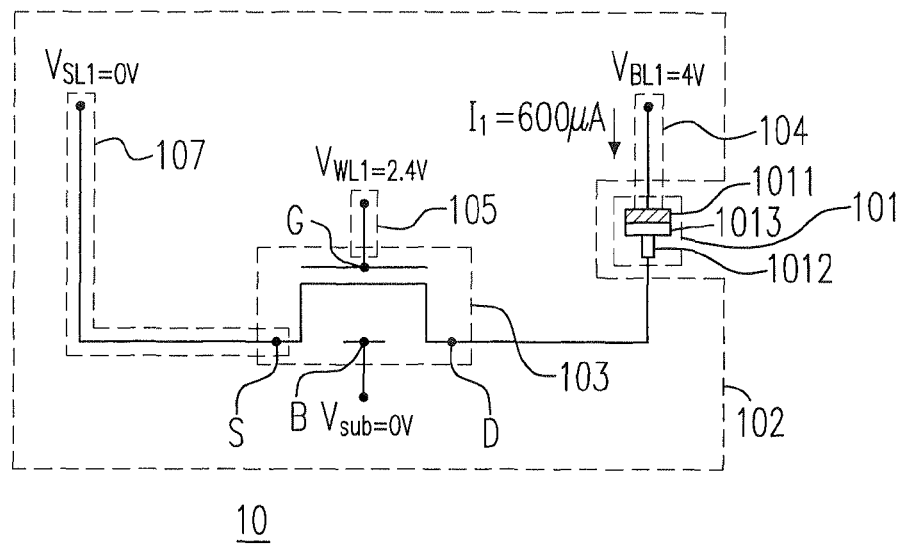
FIG. 1(a) shows a conventional unipolar addressing circuit for a memory cell.
Figure 1B:
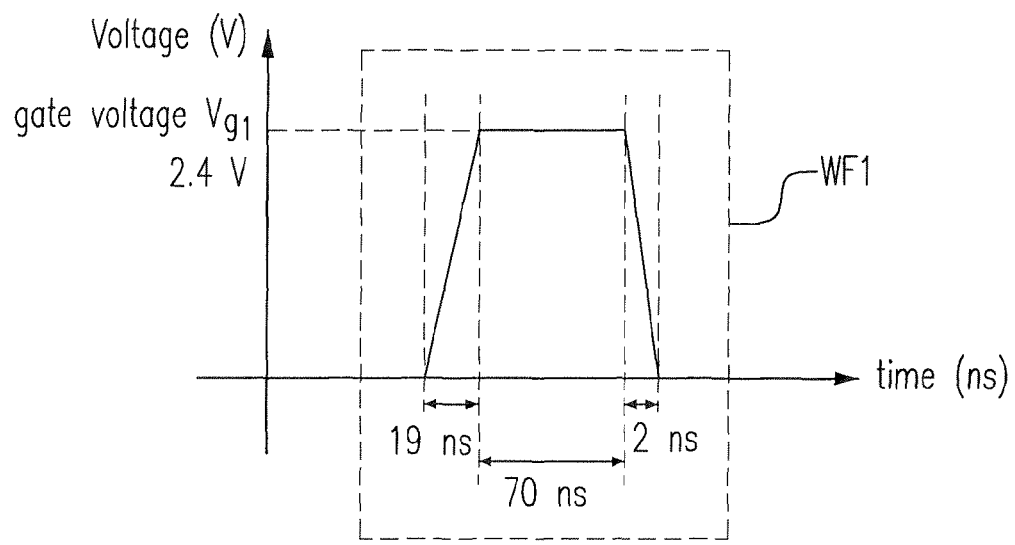
FIG. 1(b) shows the waveform of the gate voltage in the unipolar operation mode of FIG. 1(a)
Figure 1C:
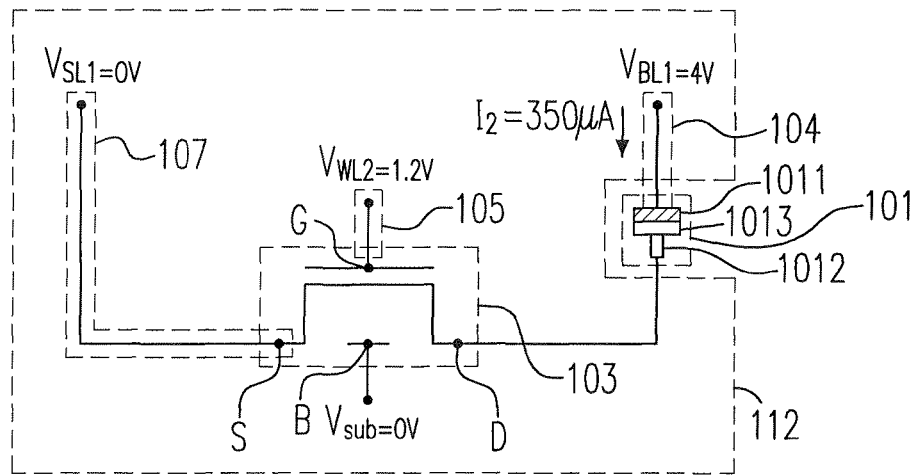
FIG. 1(c) shows another conventional unipolar addressing circuit for a memory cell.
Figure 1D:
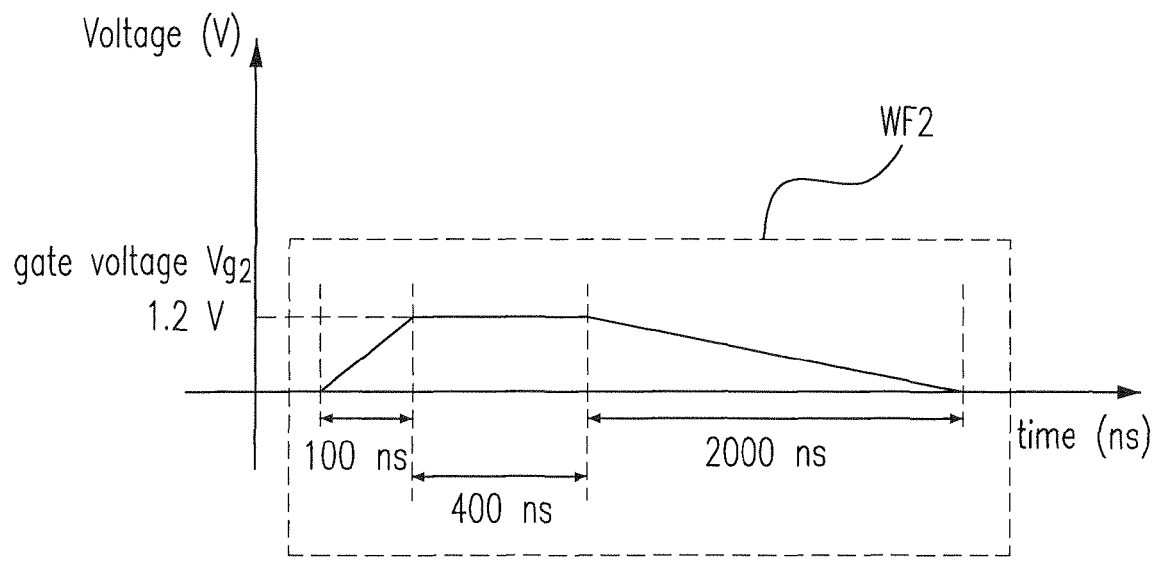
FIG. 1(d) shows the waveform of the gate voltage in the unipolar operation mode of FIG. 1(c)
Figure 2A:
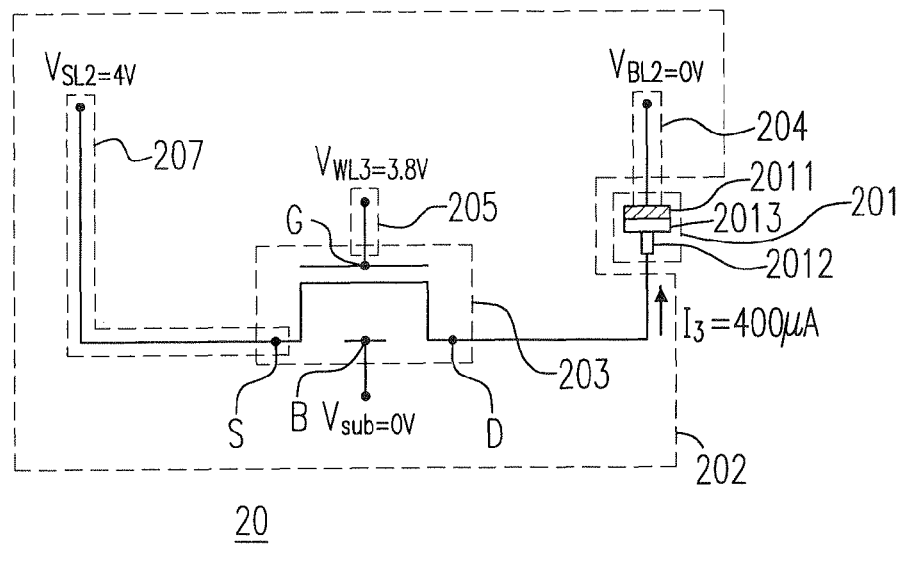
FIG. 2(a) shows a conventional bipolar addressing circuit for a memory cell.
Figure 2B:
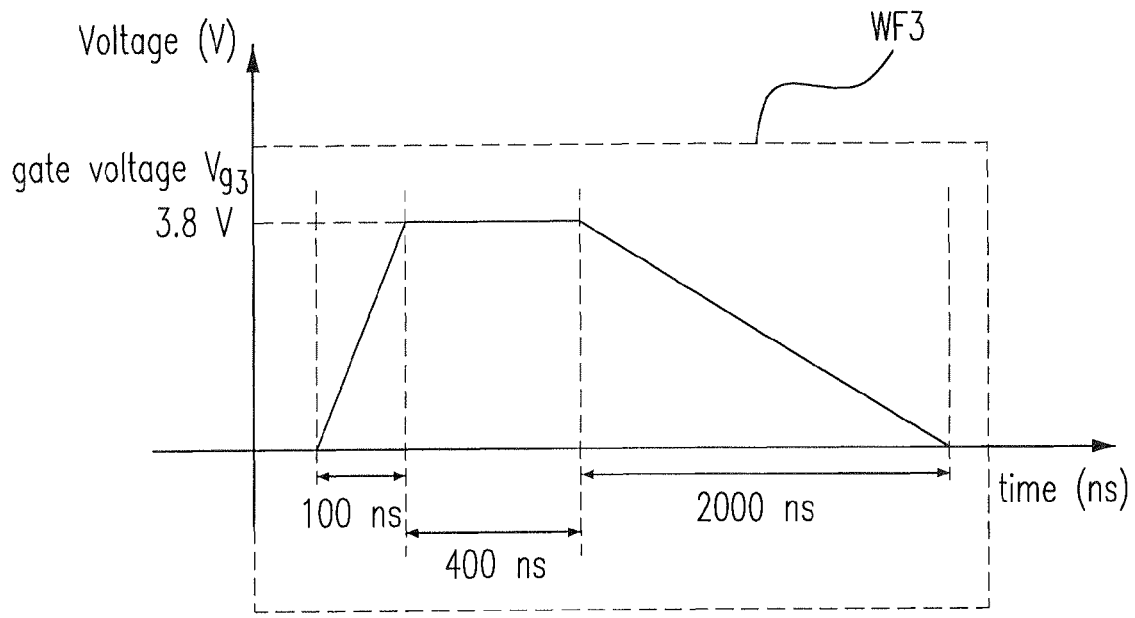
FIG. 2(b) shows the waveform of the gate voltage in the bipolar operation mode of FIG. 2(a)
Figure 2C:
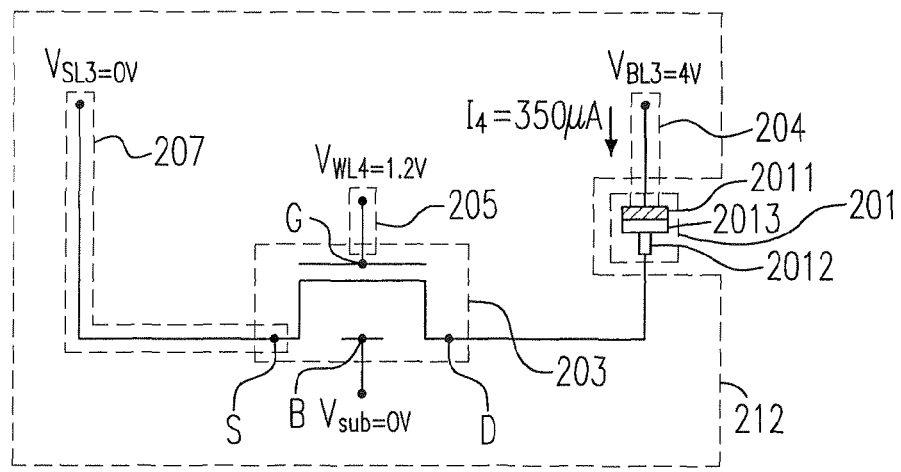
FIG. 2(c) shows another conventional bipolar addressing circuit for a memory cell.
Figure 2D:
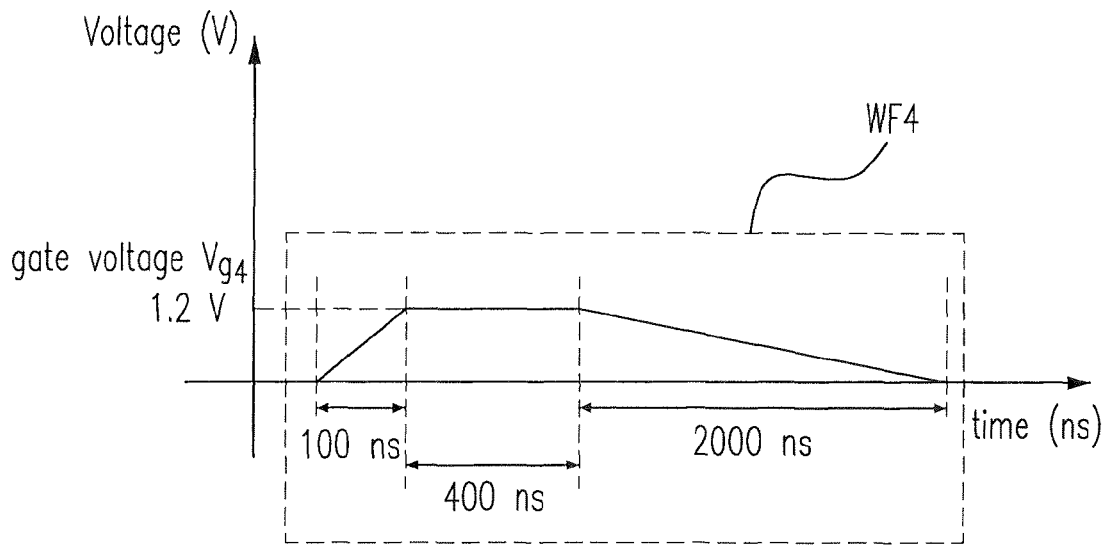
FIG. 2(d) shows the waveform of the gate voltage in the bipolar operation mode of FIG. 2(c).
Figure 3A:
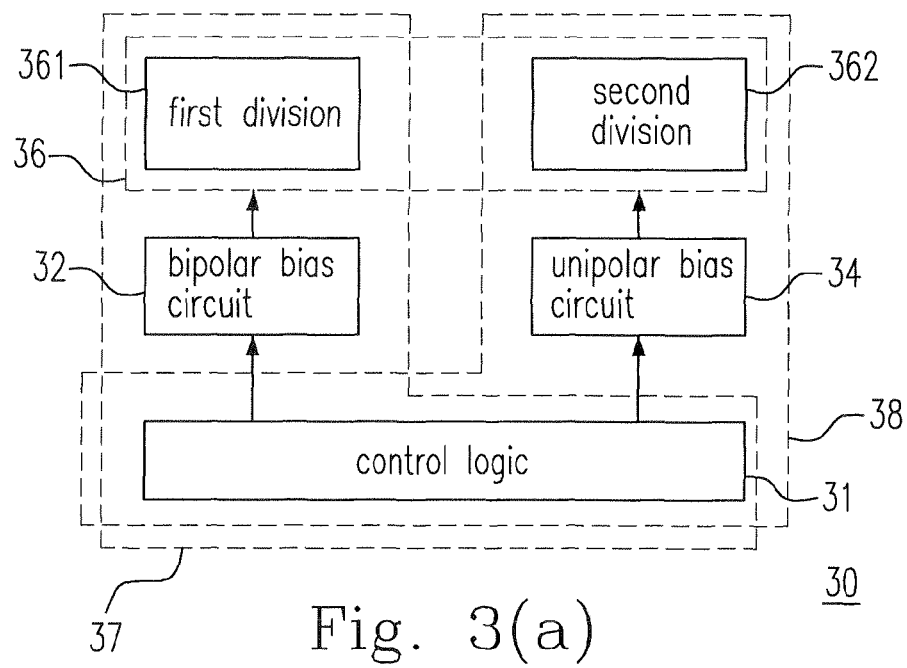
FIG. 3(a) shows a memory device according to a first embodiment of the present invention.

Please refer to FIG. 3(a), which shows a memory device according to a first embodiment of the present invention. The memory device 30 includes a memory array 36, a first circuit and a second circuit. The memory array 36 includes a first division 361 and a second division 362. In FIG. 3(a), the first circuit is a bipolar bias circuit 32, and the second circuit is a unipolar bias circuit 34. The first circuit is electrically connected to the memory array 36 for enabling the memory array 36 to be operated in a first mode. The second circuit is electrically connected to the memory array 36 for enabling the memory array 36 to be operated in a second mode.

Figure 3B:
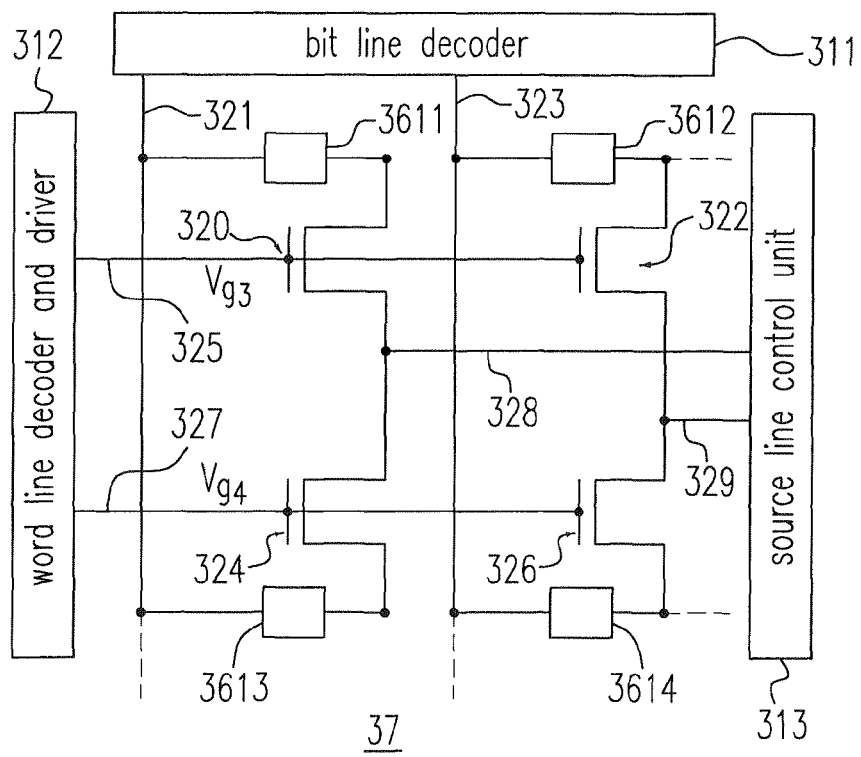
FIG. 3(b) shows the circuit of the first division operated in the first mode.

Please refer to FIG. 3(b), which shows the circuit of the first division 361 operated in the first mode. In FIG. 3(a), the circuit of the first division 361 operated in the first mode 37 includes a control logic 31, the bipolar bias circuit 32 and the first division 361. In FIG. 3(b), the bipolar bias circuit 32 includes a bit line decoder 311, a word line decoder and driver 312, and a source line control unit 313. The first division 361 includes a plurality of memory cells 3611, 3612, 3613, 3614, transistors 320, 322, 324, 326, bit lines 321, 323, 325, word lines 325, 327, and source lines 328, 329. Each memory cell of the first division 361 is one-time programmable or multiple-time programmable.

In FIG. 3(b), the bipolar bias circuit 32 can perform the programming or erasing control for different memory cells in the first division 361. For example, if the memory cell 3611 is to be programmed by using the third bias operation in a first time period, the source line control unit 313 decodes to the source line 328 and provides 4 V to the source line 328, the bit line decoder 311 decodes to the bit line 321 and provides 0 V to the bit line 321, and the word line decoder and driver 312 decodes to the word line 325 and provides the gate voltage $V_{g3}$. If the memory cell 3613 is to be erased by using the fourth bias operation in a second time period, the source line control unit 313 decodes to the source line 328 and provides 0 V to the source line 328, the bit line decoder 311 decodes to the bit line 321 and provides 4 V to the bit line 321, and the word line decoder and driver 312 decodes to the word line 327 and provides the gate voltage $V_{g4}$. The rest may be deduced by analogy. It is to be noted that the design of the bipolar bias circuit 32 is corresponding to the design of the bipolar operation mode (i.e. the first mode), and the source lines thereof need to be connected to the source line control unit 313 separately. Therefore, the design of the bipolar bias circuit 32 is more complicated and occupies a larger area. However, such bipolar operation is reliable for data retention, and can prevent data loss due to high temperature.

Figure 3C:
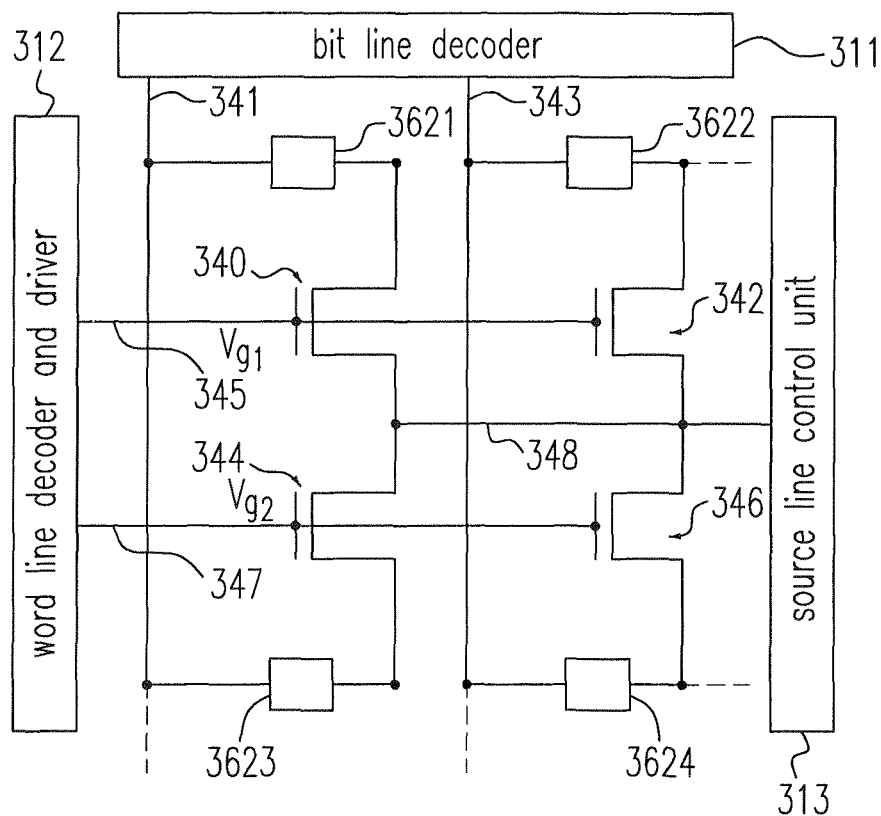
FIG. 3(c) shows the circuit of the second division operated in the second mode.

Please refer to FIG. 3(c), which shows the circuit of the second division 362 operated in the second mode. In FIG. 3(c), the circuit of the second division 362 operated in the first mode 38 includes a control logic 31, the unipolar bias circuit 34 and the second division 362. In FIG. 3(c), the unipolar bias circuit 34 includes a bit line decoder 311, a word line decoder and driver 312, and a source line control unit 313. The second division 362 includes a plurality of memory cells 3621, 3622, 3623, 3624, transistors 340, 342, 344, 346, bit lines 341, 343, 345, 347, and a source line 348. Each memory cell of the second division 361 is multiple-time programmable.

In FIG. 3(c), the unipolar bias circuit 34 can perform the programming or erasing control for different memory cells in the second division 362. For example, if the memory cell 3621 is to be programmed by using the first bias operation in a third time period, the source line 348 is grounded, the bit line decoder 311 decodes to the bit line 341 and provides 4 V to the bit line 341, and the word line decoder and driver 312 decodes to the word line 345 and provides the gate voltage $V_{g1}$. If the memory cell 3623 is to be erased by using the second bias operation in a fourth time period, the source line 348 is grounded, the bit line decoder 311 decodes to the bit line 341 and provides 4 V to the bit line 341, and the word line decoder and driver 312 decodes to the word line 347 and provides the gate voltage $V_{g2}$. The rest may be deduced by analogy. It is to be noted that the design of the unipolar bias circuit 34 is corresponding to the design of the unipolar operation mode (i.e. the second mode), and the source lines thereof can be connected with each other, or can be separated from each other. Therefore, when the sources are connected with each other, the design of the unipolar bias circuit 34 is simpler and occupies a smaller area. Besides, such unipolar operation has a higher operation speed, and the production cost thereof is lower.

In the present invention, the memory cells in the first division 361 and those in the second division 361 have the same structure and material. The main differences are that the first division 361 uses the bipolar bias circuit 32 and the second division 362 uses the unipolar bias circuit 34, and that the array circuit (source line) design in the first division 361 is different from that in the second division 362. Hence, an extra cost and engineering are unnecessary when manufacturing the memory device 30 of the present invention. In practice, the first division 361 can be designed to occupy a small portion of all memory cells, e.g. 2%, and the second division 362 can be designed to occupy a large portion of all memory cells, e.g. 98%. Such design can obtain a larger memory capacity with a smaller area (or volume). However, the ratio of the first division 361 to the second division 362 can be arbitrary, depending on the requirements of the user.

In practice, e.g. in the process of mass production, important data (e.g. the boot code) can be pre-stored in the first division 361 of the memory device 30 of the present invention. Then, the memory device 30 is soldered on the circuit board. Subsequently, the important data are decompressed or loaded from the first division 361 to the second division 362 for subsequent direct execution when the memory device 30 is first powered up. When the important data are decompressed to the second division 362, the decompressed important data are verified, depending on the requirements of the user. Certainly, the user also can write data to the second division 362, depending on the requirements of the user.

Since high temperature resulting from the soldering process will not affect the memory cells in the first division 361 to cause data loss, the memory device 30 has a reliable data retention ability. Since data are stored in the second division 362 for direct execution after booting, the memory device 30 has a high operation speed and a low production cost.

The above-mentioned important data include a plurality of key codes being ones selected from a group consisting of specific data, a plurality of directly executable program codes, a plurality of compressed program codes having a plurality of self-decompressing codes and a combination thereof.

Figure 4:
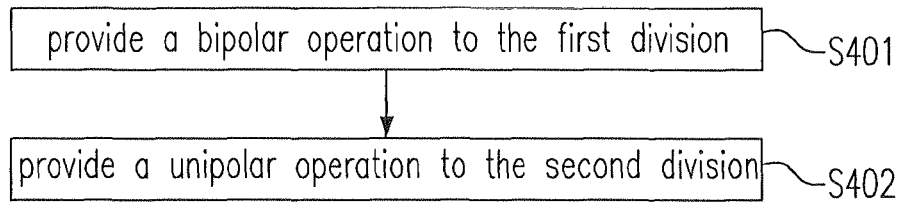
FIG. 4 shows a flowchart of the method of operating the memory device according to a first embodiment of the present invention.

Please refer to FIG. 4, which shows a flowchart of the method of operating the memory device 30 according to a first embodiment of the present invention. The memory device 30 includes the first division 361 and the second division 362. The method includes the steps of providing a bipolar operation to the first division 361 (step S401), and providing a unipolar operation to the second division 362 (step S402). Before soldering the memory device 30 on the circuit board, the bipolar operation is provided to the first division 361 to store the data therein in a reliable way. After soldering, when powering the memory device 30 for the first time, the unipolar operation is provided to the second division 362 to load the data from the first division 361 to the second division 362.

Figure 5:
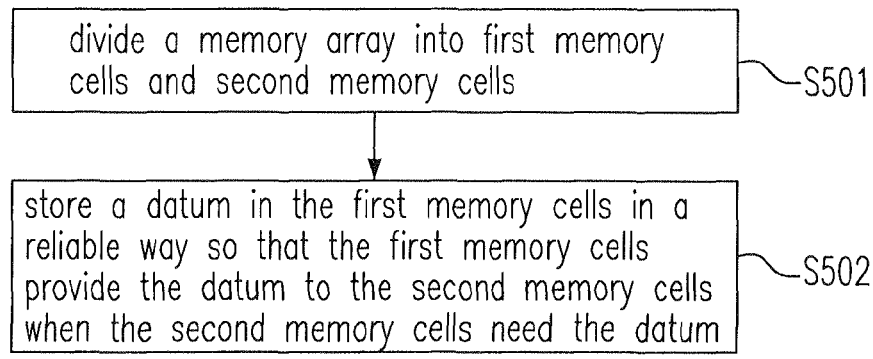
FIG. 5 shows a flowchart of the method of operating the memory device according to a second embodiment of the present invention.

Please refer to FIG. 5, which shows a flowchart of the method of operating the memory device 30 according to a second embodiment of the present invention. The method includes the steps of dividing a memory array into first memory cells and second memory cells (step S501); and storing a datum in the first memory cells in a reliable way so that the first memory cells provide the datum to the second memory cells when the second memory cell need the datum (step S502).

Figure 6:
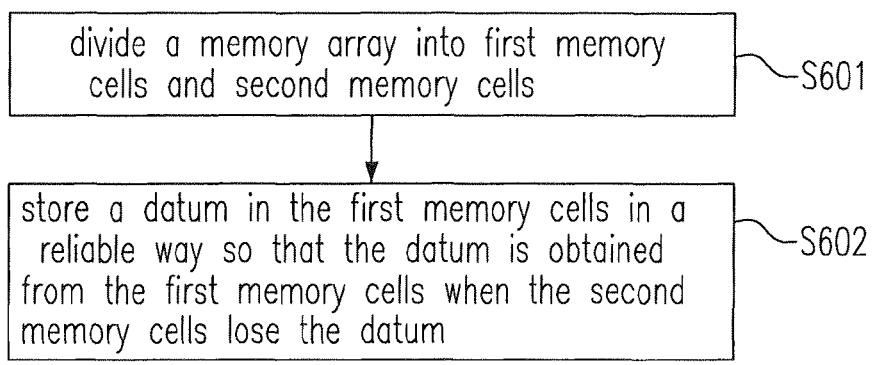
FIG. 6 shows a flowchart of the method of operating the memory device according to a third embodiment of the present invention.

Please refer to FIG. 6, which shows a flowchart of the method of operating the memory device 30 according to a third embodiment of the present invention. The method includes the steps of dividing a memory array into first memory cells and second memory cells (step S601); and storing a datum in the first memory cells in a reliable way so that the datum is obtained from the first memory cells when the second memory cells lose the datum (step S602).

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A memory device, comprising:
a memory array, including a first division having a plurality of first cells and a second division having a plurality of second cells, wherein each of the first cells and the second cells includes a first electrode, a second electrode, and a memory material between the first electrode and the second electrode;
a first circuit electrically connected to the first division, and causing the first division to be operated in a bipolar operation mode; and
a second circuit electrically connected to the second division, and causing the second division to be operated in a unipolar operation mode, wherein each of the first memory cells is operated in the bipolar operation mode, each of the first memory cells is in a high resistance state when an insulating layer is separated from the memory material, and each of the first memory cells is in a low resistance state when at least a part of the insulating layer is recombined with the memory material.

2. The memory device as claimed in claim 1, wherein the first division stores a first datum comprising a plurality of key codes being ones selected from a group consisting of specific data, a plurality of directly executable program codes, a plurality of compressed program codes having a plurality of self-decompressing codes and a combination thereof.

3. The memory device as claimed in claim 2, wherein:
the compressed program codes are decompressed from the first division to the second division for a subsequent direct execution when the memory array device is first powered up after a soldering process therefore; and
the decompressed program codes are verified when the compressed program codes are decompressed from the first division to the second division.

4. The memory device as claimed in claim 1, wherein:
the first memory cells of the first division are one-time programmable or multiple-time programmable; and
the second memory cells of the second division are multiple-time programmable.

5. The memory device as claimed in claim 1, wherein:
each of the second memory cells is operated in the unipolar operation mode, each of the second memory cells is in the high resistance state when the memory material of the second memory cell is formed into an amorphous phase, and each of the second memory cells is in the low resistance state when the memory material of the second memory cell is formed into a crystalline phase.

6. The memory device as claimed in claim 1, wherein:
the first division includes a plurality of first source lines connected respectively to transistors corresponding to the first memory cells, wherein the first source lines are separate from each other.

7. The memory device as claimed in claim 1, wherein:
the second division includes a plurality of second source lines connected respectively to transistors corresponding to the second memory cells, wherein the second source lines are connected with each other.

8. The memory device as claimed in claim 1, wherein:
the second division includes a plurality of second source lines connected respectively to transistors corresponding to the second memory cells, wherein the second source lines are separate from each other.

9. The memory device as claimed in claim 1, wherein the insulating layer comprises one or more voids.

10. The memory device as claimed in claim 1, wherein:
the memory material comprises a bulk material and a doping material;
the bipolar mode comprises a first and second bias arrangements, the first bias arrangement induces segregation of the doping material from the bulk material to form the insulating layer of the doping material; and the second bias arrangement induces re-absorption of the doping material into the bulk material.

11. The memory device as claimed in claim 10, wherein the bulk material comprises a chalcogenide material, and the doping material comprises a dielectric material.

12. A method of operating a memory device including a plurality of first memory cells in a first division, and a plurality of second memory cells in a second division, each of the first and second cells including a first electrode, a second electrode, and a memory material therebetween, comprising steps of:
providing a first circuit electrically connected to the first division operated in a bipolar operation mode;
providing a second circuit electrically connected to the second division operated in a unipolar operation mode;

providing a first bias operation to the first division to separate an insulating layer from the memory material in the first memory cells; and providing a second bias operation to the first division to recombine at least a part of the insulating layer with the memory material in the first memory cells.

13. The method as claimed in claim 12, further comprising steps of:

providing a third bias operation to the second division to enable the memory material to form a high-resistance state with an amorphous phase; and providing a fourth bias operation to the second division to enable the memory material to form a low-resistance state with a crystalline phase.

14. The method as claimed in claim 12, wherein the first division includes a first transistor, a first bit line, a first word line and a first source line, and the method further comprises steps of:

providing the first bias arrangement to the first division, wherein providing the first bias arrangement includes applying a first voltage to the first bit line, applying a second voltage to the first word line, applying the first voltage to the first transistor, and applying a third voltage to the first source line.

15. The method as claimed in claim 14, further comprising steps of: providing the second bias arrangement to the first division, wherein providing the second bias arrangement includes applying the third voltage to the first bit line, applying a fourth voltage to the first word line, applying the first voltage to the first transistor, and applying the first voltage to the first source line.

16. The method as claimed in claim 14, wherein the second division includes a second transistor, a second bit line, a second word line, a second source line and other source lines, and the method further comprises steps of:

providing the third bias arrangement to the second division, wherein providing the third bias arrangement includes applying a fifth voltage to the second bit line, applying a six voltage to the second word line, applying a seventh voltage to the second transistor, and applying the seventh voltage to the second source line.

17. The method as claimed in claim 16, further comprising steps of:

providing the fourth bias arrangement to the second division, wherein providing the fourth bias arrangement includes applying the fifth voltage to the second bit line, applying a eighth voltage to the second word line, applying the seventh voltage to the second transistor, and applying the seventh voltage to the second source line.

* * * * *